US012287446B2

(12) United States Patent
Malinouskaya et al.

(10) Patent No.: US 12,287,446 B2
(45) Date of Patent: Apr. 29, 2025

(54) METHOD FOR UPDATING A STRATIGRAPHIC MODEL OF A SEDIMENTARY BASIN BASED ON MEASUREMENTS

(71) Applicant: IFP Energies nouvelles, Rueil-Malmaison (FR)

(72) Inventors: Iryna Malinouskaya, Rueil-Malmaison (FR); Patrick Rasolofosaon, Rueil-Malmaison (FR); Veronique Gervais-Couplet, Rueil-Malmaison (FR); Didier Granjeon, Rueil-Malmaison (FR)

(73) Assignee: IFP ENERGIES NOUVELLES, Rueil-Malmaison (FR)

( * ) Notice: Subject to any disclaimer, the term of this patent is extended or adjusted under 35 U.S.C. 154(b) by 1160 days.

(21) Appl. No.: 17/119,765

(22) Filed: Dec. 11, 2020

(65) Prior Publication Data
US 2021/0199844 A1 Jul. 1, 2021

(30) Foreign Application Priority Data

Dec. 12, 2019 (FR) ..................................... 1914308

(51) Int. Cl.
*G01V 20/00* (2024.01)
*G01V 1/48* (2006.01)
(Continued)

(52) U.S. Cl.
CPC ............... *G01V 20/00* (2024.01); *G01V 1/48* (2013.01); *G01V 1/50* (2013.01); *G06F 18/231* (2023.01);
(Continued)

(58) Field of Classification Search
CPC ...... G06F 30/20; G06F 18/231; G06F 18/241; G06V 10/761; G01V 1/48; G01V 1/50;
(Continued)

(56) References Cited

U.S. PATENT DOCUMENTS

| 4,679,174 A | 7/1987 | Gelfand |
| 2012/0109597 A1 | 5/2012 | Derfoul et al. |

(Continued)

FOREIGN PATENT DOCUMENTS

EP 2447467 A1 5/2012

OTHER PUBLICATIONS

Süss, M. Peter, and John H. Shaw. "P wave seismic velocity structure derived from sonic logs and industry reflection data in the Los Angeles basin, California." Journal of Geophysical Research: Solid Earth 108.B3 (2003). (Year: 2003).*

(Continued)

*Primary Examiner* — John E Johansen
(74) *Attorney, Agent, or Firm* — Fitch, Even, Tabin & Flannery LLP

(57) ABSTRACT

The present invention is a method for exploiting a sedimentary basin using an updated stratigraphic model based on updating a stratigraphic model according to measurements performed in a basin. The method comprises steps of i) determining at least a first spatial distribution of the values of an attribute representative of the basin stratigraphy, and applying a classification method for converting this first spatial distribution to a first classified image; ii) performing a stratigraphic simulation with first parameter values of the simulation, deducing therefrom a second spatial distribution of the values of the attribute and applying the same classification method identically to determine a second classified image; iii) determining a distribution of local dissimilarities between the first and second classified images, and modi- (Continued)

fying the values of at least one of the stratigraphic simulation parameters to minimize an objective function formed from at least the local dissimilarity distribution; and iv) updating the stratigraphic model by performing at least one stratigraphic simulation with the modified simulation parameter values.

19 Claims, 7 Drawing Sheets

(51) Int. Cl.
    *G01V 1/50*     (2006.01)
    *G06F 18/231*     (2023.01)
    *G06F 18/241*     (2023.01)
    *G06F 30/20*     (2020.01)
    *G06T 17/05*     (2011.01)
    *G06V 10/74*     (2022.01)
    *G01V 1/28*     (2006.01)
    *G01V 1/30*     (2006.01)

(52) U.S. Cl.
    CPC ............ *G06F 18/241* (2023.01); *G06F 30/20* (2020.01); *G06T 17/05* (2013.01); *G06V 10/761* (2022.01); *G01V 1/282* (2013.01); *G01V 1/306* (2013.01); *G01V 2210/661* (2013.01)

(58) Field of Classification Search
    CPC .. G01V 1/282; G01V 1/306; G01V 2210/661; G01V 20/00; G06T 17/05
    USPC .......................................................... 703/10
    See application file for complete search history.

(56) References Cited

U.S. PATENT DOCUMENTS

2016/0298427 A1* 10/2016 Kauerauf ................ G06F 30/20
2020/0183031 A1* 6/2020 Denli ..................... G01V 1/282

OTHER PUBLICATIONS

Lee, Kyungbook, et al. "Iterative static modeling of channelized reservoirs using history-matched facies probability data and rejection of training image." Petroleum Science 16 (2019): 127-147. (Year: 2019).*

Preliminary Search Report for FR 19 13 783, dated Aug. 27, 2020 (2 pages).

Rafael Souza et al: Analysis of time-lapse seismic and production data for reservoir model classification and assessment, Journal of Geophysics and Engineering, Institute of Physics Publishing, Bristol, GB, vol. 15, No. 4, May 9, 2018 (May 9, 2018), pp. 1561-1587, XP020329341, ISSN: 1742-2140, DOI.

* cited by examiner

[Fig 1]
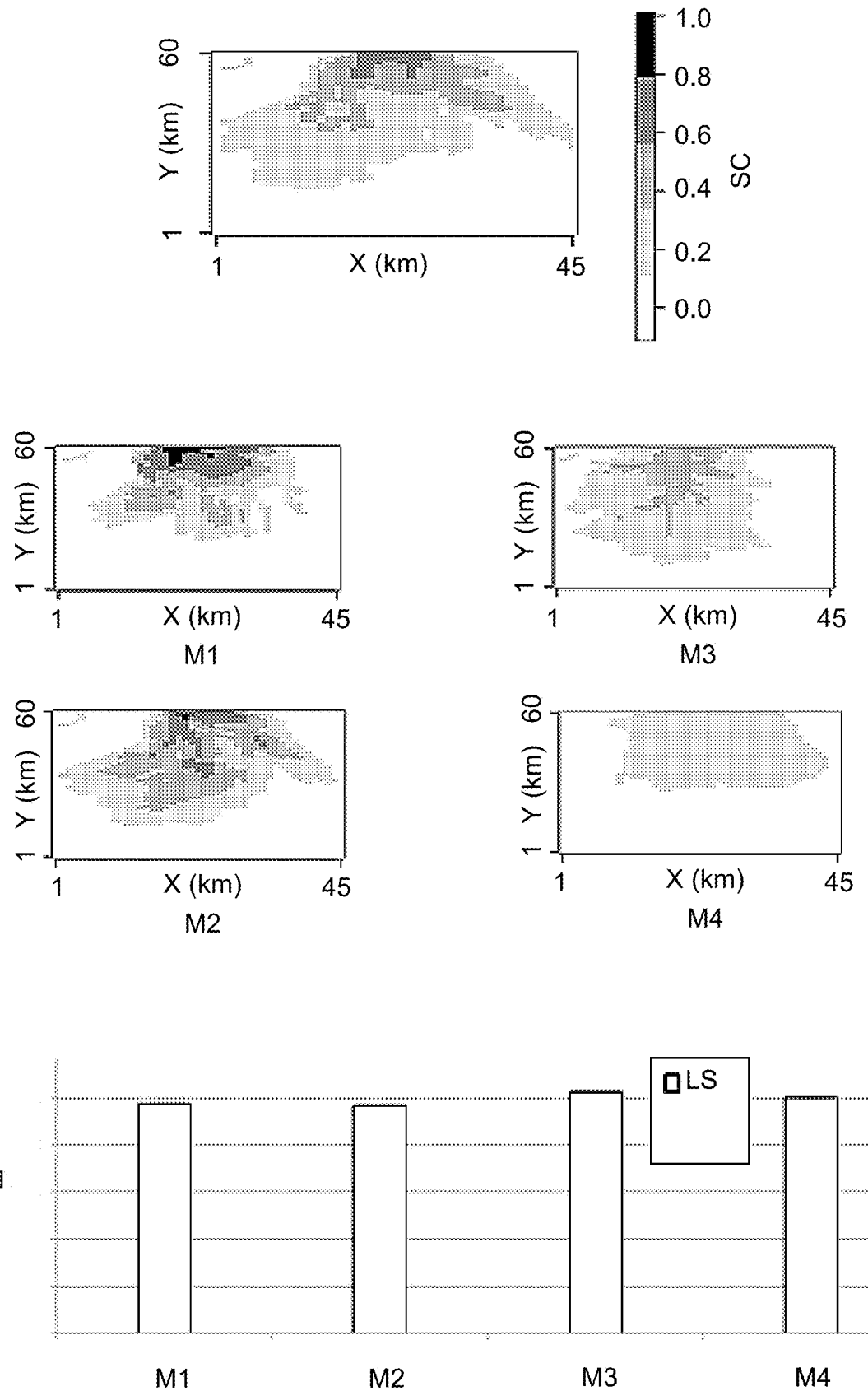

[Fig 2]
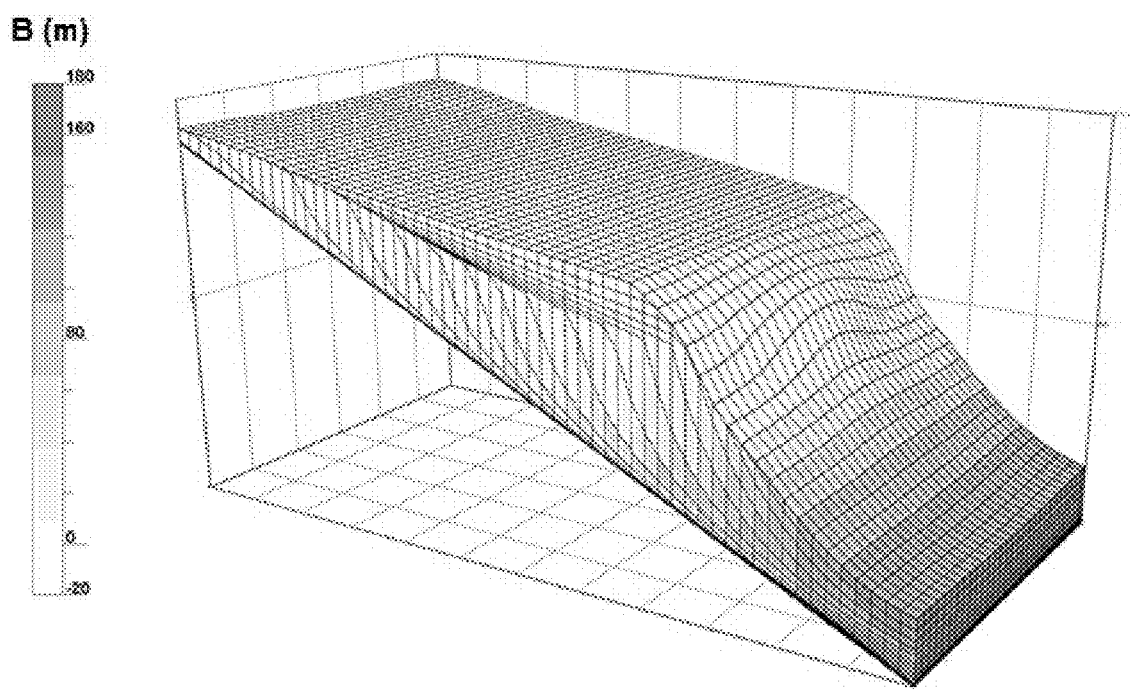

[Fig 3]
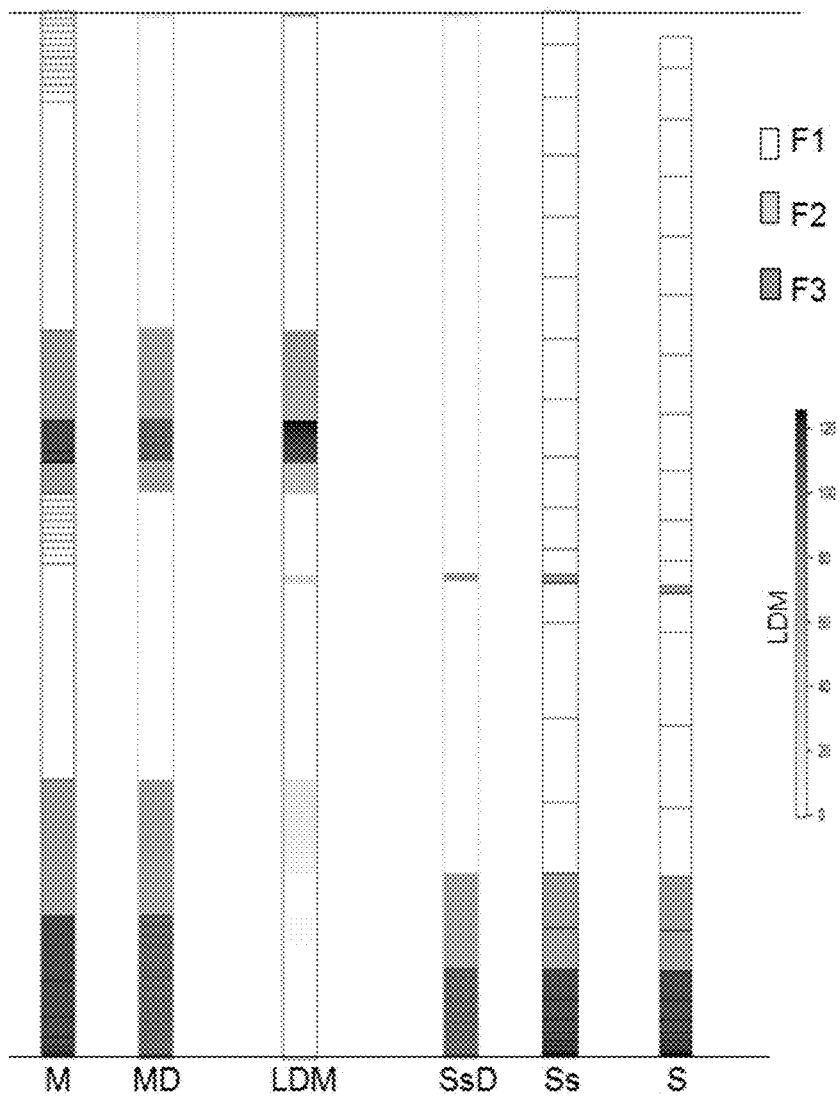
[Fig 4]
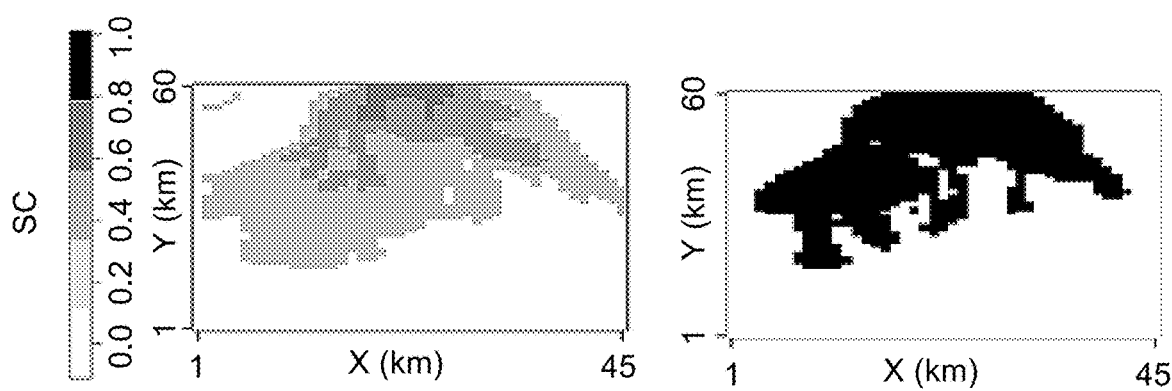

[Fig 5]
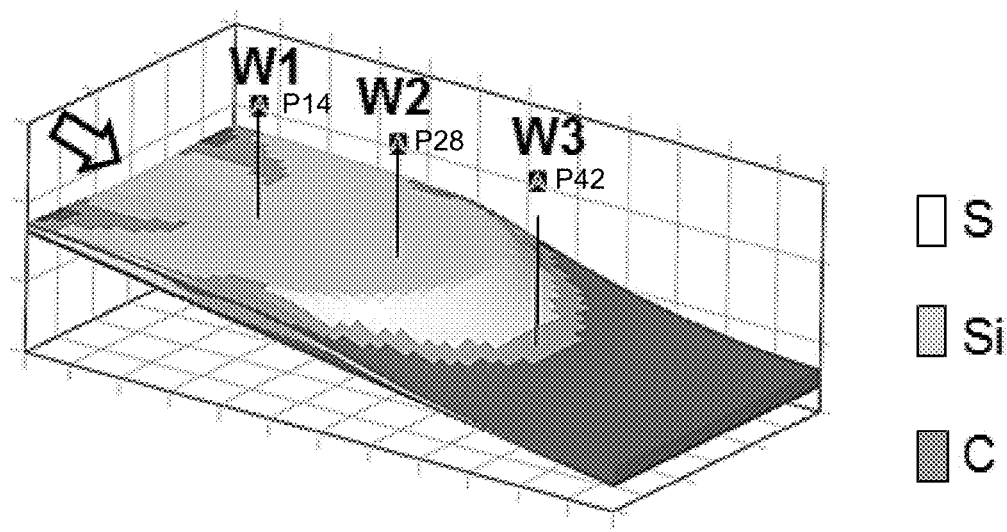
[Fig 6]
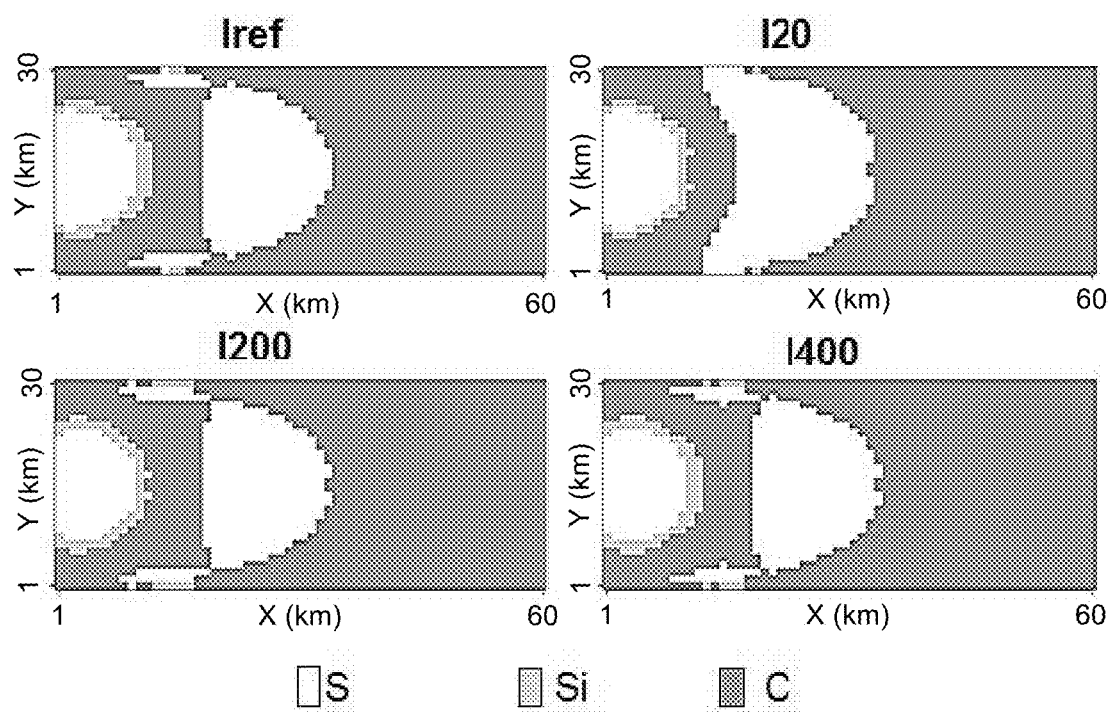

[Fig 7]
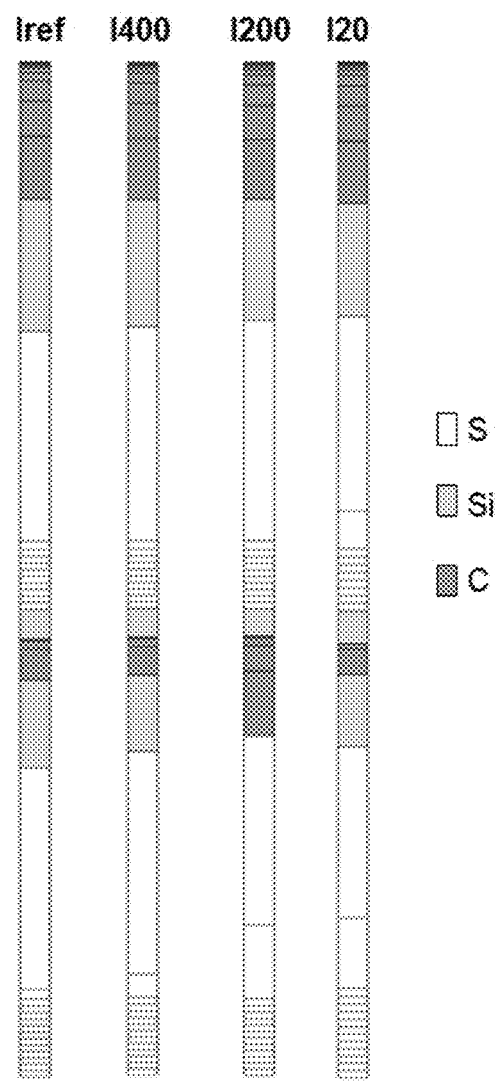

[Fig 8]
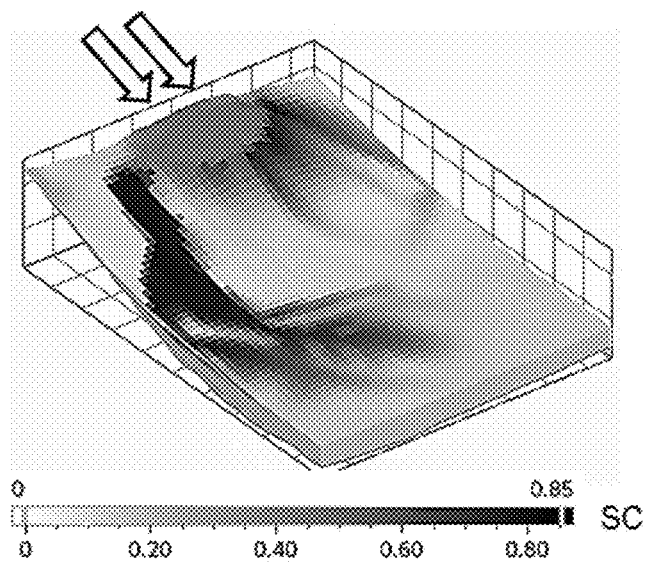
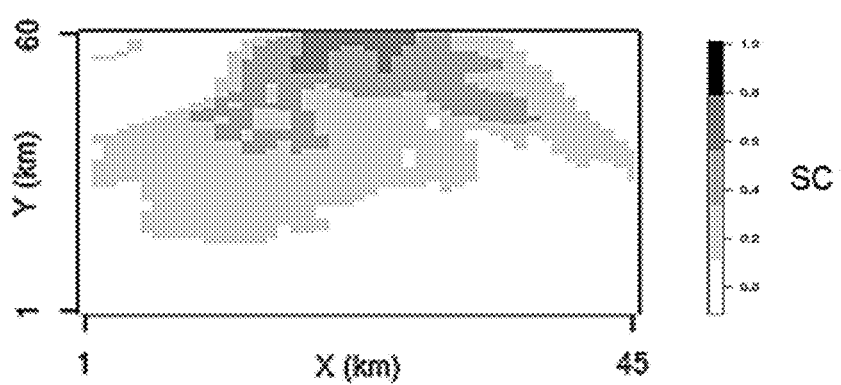

[Fig 9]
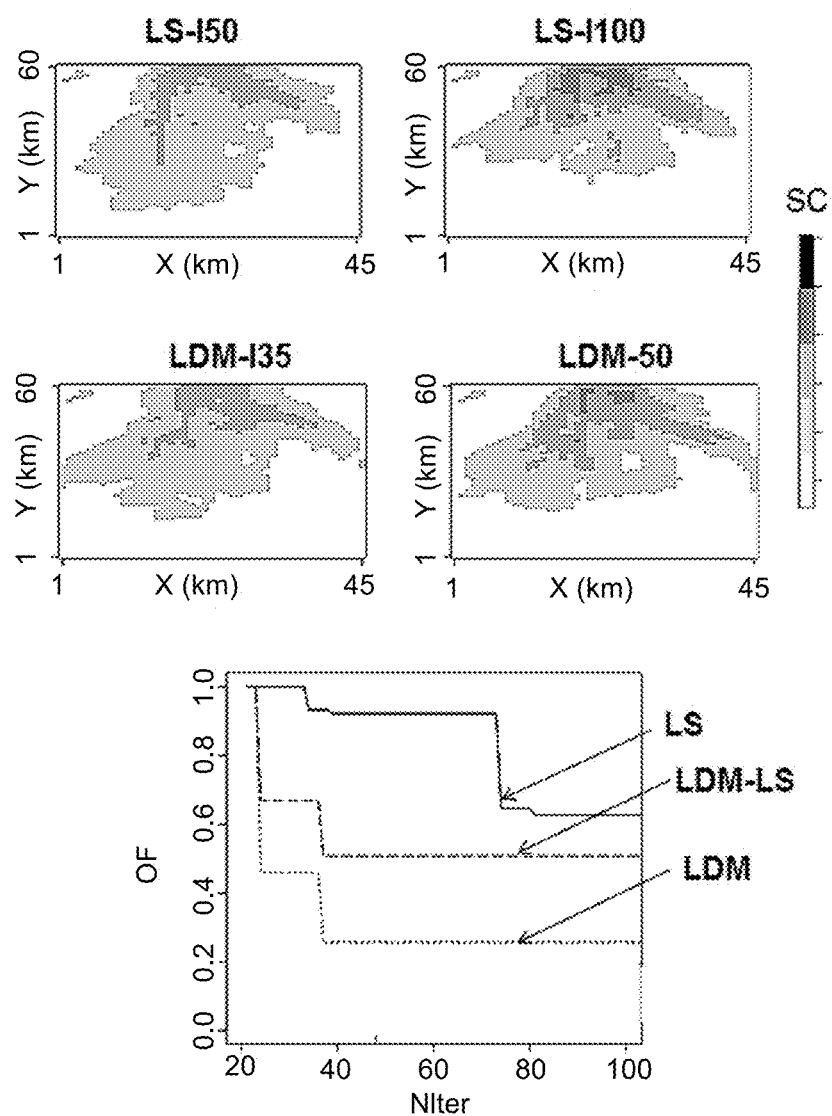

METHOD FOR UPDATING A STRATIGRAPHIC MODEL OF A SEDIMENTARY BASIN BASED ON MEASUREMENTS

CROSS-REFERENCE TO RELATED APPLICATIONS

This application claims priority to French Patent Application No. 19/14.308, filed Dec. 12, 2019, the contents of which are incorporated herein by reference in their entirety.

BACKGROUND OF THE INVENTION

Field of the Invention

The present invention relates to the field of petroleum reservoir or geological gas storage site exploration and exploitation. The present invention also relates to the field of new energies such as geothermal energy or underground energy storage. In general terms, the present invention can be used in any field requiring characterization of the geometry and the nature of the sedimentary rocks that make up the subsoil.

Petroleum exploration is the search for hydrocarbon reservoirs within a sedimentary basin. Understanding, the principles of hydrocarbon genesis and the connections thereof with the subsurface geological history has allowed development of methods for assessing the petroleum potential of a sedimentary basin. The general procedure for assessing the petroleum potential of a sedimentary basin comprises shuttling between a prediction of the petroleum potential of the sedimentary basin, from measured data relative to the basin being studied (outcrop analysis, seismic surveys, drilling data for example), and exploratory drilling operations in the various zones having the best potential, in order to confirm or invalidate the previously predicted potential and to acquire new data intended to specify the petroleum potential predictions for the basin being studied.

Petroleum reservoir exploitation is, from data collected during the petroleum exploration phase, selecting the reservoir zones with the best petroleum potential, in defining exploitation schemes for these zones (using reservoir simulation for example in order to define the number and positions of the exploitation wells allowing maximum hydrocarbon recovery), in drilling exploitation wells and, in general terms, in putting in place the production infrastructures necessary for reservoir development.

Petroleum potential assessment of a sedimentary basin can be done either in a probabilistic manner or analytically. The analytical approach is most often implemented using computer software programs enabling synthesis of the available data and simulation of the geological history of the basin being studied. Depending on the complexity of the geological history of the basin being studied, the family of softwares used for the analytical approach can comprise one, two or three-dimensional simulation of the sedimentary, tectonic, thermal, hydrodynamic, organic and inorganic chemical processes involved in the formation of a petroleum basin. This is referred to as a "basin modelling" approach.

Concerning more particularly sedimentary process modelling, software programs known as stratigraphic simulation or stratigraphic simulation programs are used. The purpose of stratigraphic modelling is to simulate the evolution of a sedimentary basin over geologic time in order notably to quantify the geometry of sedimentary layers, the type of sediments that have settled, the water depth at the time of deposition, etc. 3D stratigraphic models numerically solved via software programs run on computers, such as the DionisosFlow® stratigraphic simulator (IFP Energies nouvelles, France), are known.

In general terms, stratigraphic simulation uses a set of equations describing the physical processes involved in the formation of sedimentary basins, whose solution provides a series of stratigraphic models representing the architecture and the composition of the sedimentary layers in the subsoil of a sedimentary basin. Stratigraphic simulation requires defining the basin topography at the beginning of the oldest stratigraphic unit being studied. The simulation then studies the amount and composition distribution of the sediments, eroded, displaced or deposited in the basin over time according to the sediment supply (e.g. fluvial sediment supply or carbonate production), the capacity of sediments to be transported in the basin and the basin deformation (e.g. tectonic, sea or lake level variations, compaction).

A stratigraphic model in the form of a numerical representation of the basin being studied is obtained at the end of a stratigraphic simulation. The numerical basin representation generally comes in a form of a grid or mesh representing the structure of the sedimentary layers deposited in the basin. Each cell of the grid is also characterized by the composition of the deposited sediments and by the depositional environment.

The result of a stratigraphic simulation directly depends on the simulation input parameters, such as the initial bathymetry, the sediment transport coefficients or the sediment supply. Now, these stratigraphic simulation input parameters are often not known with precision. Indeed, these parameters are generally assessed from various measurements performed in situ. Thus, the initial bathymetry can be assessed from a (fluvial, coastal, deep sea) depositional environment interpretation of well data and seismic data; the transport coefficients can be defined from modern sedimentary environments (which are observed at the current time) by comparing for example the flow of sediments transported by rivers with the discharge of these rivers; the sediment supply can be assessed from the volume of sediments deposited in the study area. Thus, the stratigraphic simulation parameters do not result from direct measurements, but from an interpretation of in-situ measurements.

Therefore, if the input parameters are not accurate, the stratigraphic simulation result itself is not representative of the real stratigraphy of the basin being studied. In order to be used to characterize the subsoil of a sedimentary basin, a stratigraphic model is representative of this basin only if it is coherent with the various data available for this basin, at least the log data measured along an exploration well (providing information on the rock types or the porosity of the sedimentary layers encountered along the well for example) and the data resulting from 2D or 3D seismic surveys (providing information on the geometry of the sedimentary layers that make up the sedimentary basin, and possibly on the deposit type for example). Thus, the value of the stratigraphic simulation input parameters needs to be updated for the stratigraphic model obtained to be as coherent as possible with the measurements performed in the basin. The measurements performed in the basin and allowing a stratigraphic model to be validated are referred to hereafter as "observed data" or simply "data".

Description of the Prior Art The following documents are mentioned in the description hereafter:

L. Saiida, D. Guérillot (1998) Méthode Pour Former Automatiquement un Modèle Simulant la Structure Stratigraphique d'une Zone Souterraine. Brevet 2776393.

K. Charvin, K. Gallagher, G. L. Hampson, R. Labourdette (2009) A Bayesian Approach to Inverse Modeling of Stratigraphy, Part 1: Method. Basin Research, 21, 5-25.

O. Falivene, A. Frascati, S. Gesbert, J. Pickens, Y. Hsu, A. Rovira (2014) Automatic Calibration of Stratigraphic Forward Models for Predicting Reservoir Presence in Exploration. AAPG Bulletin, 98(9), 1811-1835.

E. Baudrier, G. Millon, F. Nicolier, S. Ruan (2008) Binary Image Comparison with Local Dissimilarity Quantification. Pattern Recognition, 41(5), 1461-1478.

C.-H. Koeck, G. Bourdarot, G. Al-Jefri, F. H. Nader, R. Richet, A. Barrois (2015) Improving a Numerical Sequence Stratigraphic Model Through a Global Sensitivity Analysis; Giant Carbonate Offshore Field, Abu Dhabi. SPE-177758-MS, Abu Dhabi International Petroleum Exhibition and Conference, Abu Dhabi, UAE, 9-12 Nov. 2015.

T. Duan (2017) Similarity Measure of Sedimentary Successions and Its Application in Inverse Stratigraphic Modeling. Pet. Sci., 14, 484-492.

I. S. Molchanov, P. Teran (2003) Distance Transforms for Real-Valued Functions. J. Math. Anal. Appl., 278, 472-484.

D. Mckay (2003) Information Theory, Inference and Learning Algorithms. Cambridge University Press, ISBN 0-521-64298-1.

Ng A. Y., Jordan M. I. and Weiss Y. (2002) On Spectral Clustering: Analysis and an Algorithm. In: *Advances in Neural Information Processing Systems* 14, Vols 1 and 2, 849-856.

Kohonen T. (2001) *Self-Organizing Maps*. Springer, Berlin, 525 p.

Grus J. (2016), K-means and Hierarchical Clustering with Python, O'Reilly, ISBN: 9781491965306.

D. Sinoquet, F. Delbos (2008) Adapted Nonlinear Optimization Method for Production Data and 4D Seismic Inversion. Proceedings of ECMOR XI Conference, Bergen, Norway, September 2008.

D. R. Jones, M. Schonlau, W. J. Welch (1998) Efficient Global Optimization of Expensive Black-Box Functions. Journal of Global Optimization, 13, 455-492.

There are known methods for updating a stratigraphic model according to observed data for continuous properties, based on error formulations quantifying the difference between this data and the corresponding simulated values. For example, in the document (Saiida et al., 1998), the objective function is defined as the sum of squared differences between the simulated and measured sediment thickness in each layer along a well. This formulation is also used in the document (Charvin et al., 2009) to reproduce the grain size distribution along wells, as well as a total thickness profile of the sediments deposited in a section of the basin (total thickness in each column). Finally, the document (Falivene et al., 2014) considers the sum of differences in absolute value between simulated data and measured data in each cell in order to assess the error on a total thickness map (x,y). These approaches, referred to as cell to cell comparison, attempt to reproduce exactly all the data by considering the sum of errors on each datum and by minimizing this sum of errors. Such approaches provide a solution for which the average of the errors is minimized. This involves that there may be several models characterized by the same average of errors, but with a different spatial distribution of the error.

This is illustrated in FIG. 1. More precisely, FIG. 1, at the top, shows an observed sand concentration map SC (referred to as "reference model" hereafter), i.e. the map that it is sought to be reproduced. The central four FIGS. of FIG. 1 show examples of simulated sand concentration maps, denoted by M1, M2, M3 and M4 (referred to as "simulated models" hereafter), obtained by modifying some characteristics of the reference model (input parameters). FIG. 1, bottom, shows a histogram whose white columns LS represent the normalized sum, in all the cells, of the squared difference between the observed sand concentration and the simulated sand concentration for each simulated model M1, M2, M3 and M4. In other words, each column LS represents the error E between the reference model and the simulated models, calculated by a cell to cell comparison of the measured and simulated data. As can be seen in the FIG., simulated models M1, M2, M3 and M4 are very different from one another, some reproducing the location of the channels observed on the reference model better than others, while the associated error E is very close (the heights of columns LS of the histograms relative to simulated models M1, M2, M3 and M4 are similar). Therefore, a cost function based on the sum of errors cell to cell between measured and simulated data is not necessarily sufficient to correctly classify stratigraphic models as regards the representativity of the spatial variations of properties in relation to the real spatial variations thereof.

Besides, the data that is to be reproduced may be uncertain, and it is not necessarily relevant to try to reproduce exactly the distribution of these values. These uncertainties are first related to measurement errors. Furthermore, the data is generally acquired at finer resolutions than those considered for stratigraphic simulation. Finally, the data may result from measurement processing (this is notably the case with seismic data, which is necessarily subjected to seismic processing prior to being exploited), which introduces additional uncertainties. Thus, it is not necessarily desirable to try to reproduce precisely data that turns out to be uncertain.

Finally, the challenge of comparing discrete data such as facies arises. Two known documents introduce 1D facies succession comparison techniques. The document (Koeck et al., 2015) considers a succession of reference facies and a succession of simulated facies in the same discretization grid in geologic time (the one used for simulation). The difference between the two successions is then defined via the sum in each cell of the absolute value of the difference between the observed facies index and the simulated facies index. The absolute value of the difference between the observed sequence thickness and the simulated sequence thickness comes in addition to this error term. This approach is however based on the indices associated with each facies that have no physical meaning (they are categorical properties). The error calculated here therefore depends on the choice of these indices. The document (Duan, 2017) considers the two facies successions to be compared as chains of pairs {facies index, thickness} and it uses a syntactic approach to compare these chains: their dissimilarity is quantified according to the number of continuation, insertion and substitution operations required to switch from one chain to the next.

SUMMARY OF THE INVENTION

The present invention is designed to overcome these drawbacks. Notably, the present invention attempts to reproduce the measured data relative to a property by identifying the location of zones having close values for this property (such as, for example, channels characterized by a certain sand proportion range). The method according to the invention is therefore notably based on a reorganization of the data into classes, and the resolution level of the model obtained in relation to the measured data can depend on the ranges of values selected for each class. In other words, the method according to the invention allows extraction of discriminant features for the data (zones of geological coherence) and it attempts to find these features. Moreover, the present invention allows the facies to be treated as categorical data, that is geological objects whose location is to be found.

Furthermore, the present invention allows, in some way, to take account of the uncertainties on the continuous data. Indeed, it is not intended here to calibrate exactly the continuous datum provided cell by cell, but rather a degraded datum informing on the main trends, here the location of zones of interest defined from the data. Thus, the objective is to reproduce for example the shape of the channels defined by a sufficiently great sand concentration or thickness, but not the exact distribution of the sand concentration or height in this zone.

Furthermore, the present invention can simultaneously address the geometry of the basin layers and the properties of the sediments in these layers. Indeed, if the data to be calibrated depends on depth (well data for example), it is possible to both integrate a depth error term and a sediment property error term in the cost function.

The present invention relates to a computer-implemented method for updating a stratigraphic model of a sedimentary basin according to measurements performed in the basin, by a stratigraphic simulation and from parameter values of the stratigraphic simulation. The method according to the invention comprises at least the following steps:

A. measuring physical quantities relative to the basin by sensors, the measurements comprising at least log measurements and seismic measurements;

B. from the measurements, determining at least a first spatial distribution of values of an attribute representative of the stratigraphy of the basin, and determining a first classified image relative to the first spatial distribution by a classification method for grouping the values of the attribute of the first spatial distribution into at least two classes;

C. determining a stratigraphic model by stratigraphic simulation is performed with the values of the parameters of the simulation, D. deducing therefrom at least a second spatial distribution of values of the attribute representative of the stratigraphy of the basin, and determining a second classified image relative to the second spatial distribution by use of the classification method for grouping the values of the attribute of the second spatial distribution according to the at least two classes of the first classified image;

E. determining a distribution of local dissimilarities between the first and second classified images, and modifying a value of at least one of the parameters of the stratigraphic simulation to minimize an objective function formed from at least the distribution of the local dissimilarities; and F. updating the stratigraphic model by repeating at least step C with the modified values of the simulation parameters.

According to an implementation of the invention, the stratigraphic model can be updated in step F by repeating the sequence of steps C, D and E until the objective function meets at least one predefined criterion.

According to an implementation of the invention, when the second spatial distribution of the values of the attribute is defined on a spatial support different from the spatial support of the first spatial distribution of the values of the attribute, at least the second spatial distribution of the values of the attribute can be resampled so that the first and second spatial distributions of the values of the attribute are defined on an identical spatial support.

According to an implementation of the invention, the objective function can be formed from at least one weighted sum of the squared local dissimilarities observed in each pixel of the first and second classified images.

According to an implementation of the invention, the objective function can further comprise an error term related to the resampling of at least the second spatial distribution of the values of the attribute.

According to an implementation of the invention, the attribute representative of the stratigraphy can be selected from among the lithologic facies, the thickness of a stratigraphic unit, the average sand concentration in a stratigraphic unit, and the average clay concentration in a stratigraphic unit.

According to an implementation of the invention, the classification method can be selected from among- the K-means method, the spectral partitioning method, the self-organizing map method or the hierarchical clustering method.

According to an implementation of the invention, the Hausdorff distance can be used to determine the local dissimilarity distribution.

Furthermore, the invention relates to a computer program product downloadable from at least one of a communication network, recorded on a computer-readable medium and processor executable, comprising program code instructions for implementing the method as described above, when the program is executed on a computer.

The invention also relates to a method for exploiting hydrocarbons present in a sedimentary basin, the method comprising at least implementing the method for updating the stratigraphic model of the basin as described above, and wherein, from at least the updated stratigraphic model, an exploitation scheme is determined for the basin, comprising at least one site for at least one injection well and/or at least one production well, and the hydrocarbons of the basin are exploited at least by drilling the wells of the site and by providing them with exploitation infrastructures.

BRIEF DESCRIPTION OF THE DRAWINGS

Other features and advantages of the method according to the invention will be clear from reading the description hereafter of embodiments given by way of non limitative example, with reference to the accompanying figures wherein:

FIG. 1 illustrates an update of a stratigraphic model using a method according to the prior art;

FIG. 2 illustrates an example of a gridded representation of a sedimentary basin in three-dimensional view;

FIG. 3 illustrates an optional step of resampling between measured data and simulated data for implementing the method according to the first aspect of the invention;

FIG. 4 illustrates the classification step of the method according to the first aspect of the invention;

FIG. 5 illustrates an example of a representation of a sedimentary basin constructed from seismic measurements and log measurements performed in three wells;

FIGS. 6 and 7 illustrate results of the implementation of the method according to the first aspect of the invention when the property to be found is a sedimentary facies;

FIG. 8 illustrates an example of a representation of a sedimentary basin constructed from seismic measurements and log measurements, as well as the spatial distribution of the sand concentration for each column of this gridded representation; and FIG. 9 illustrates results of the implementation of the method according to the first aspect of the invention when the property to be found is a sand concentration.

DETAILED DESCRIPTION OF THE INVENTION

According to a first aspect, the invention relates to a computer-implemented method for updating a stratigraphic model of a sedimentary basin according to measurements performed in the basin.

According to a second aspect, the invention relates to a method for exploiting hydrocarbons present in a sedimentary basin, the method according to the second aspect comprising implementing the method in order to update a stratigraphic model of a sedimentary basin according to the first aspect of the invention.

The method according to the first aspect of the invention comprises at least steps 1 to 7 described hereafter, followed by at least one repetition of step 3. According to a main variant of the invention, after a first implementation of steps 1 to 7, steps 3 to 7 are at least repeated once.

The method according to the second aspect of the invention further comprises at least step 8 described hereafter.

1) Measuring Physical Quantities Relative to the Basin

This step measures physical quantities relative to the basin using sensors, the measurements including at least log measurements and seismic measurements.

Log measurements are understood to be measurements performed in at least one well drilled in a basin, using a logging tool or probe that is moved along the well to measure a physical quantity relative to the geological formation close to the well. Log measurements allow assessment of for example the water and hydrocarbon content at each measurement interval, the dominant lithology (or lithologic facies) and notably at least one of the sand and clay content of the rocks penetrated, as well as the dip and the thickness of the layers. According to an implementation of the invention, the physical quantities measured can include the electrical resistivity, the natural gamma radioactivity and the spontaneous polarization. A log measurement is a local measurement along the well, of limited lateral extension.

Seismic measurements are understood to be measurements performed using a seismic data acquisition device, conventionally comprising at least one seismic source (for example, a water gun for marine seismic or a vibrator truck for land seismic measurement) for generating seismic waves in the basin and a seismic wave receivers (such as accelerometers, hydrophones) positioned to record at least seismic waves reflected on impedance contrasts of the basin (such as erosional surfaces, stratigraphic unit boundaries). Conventionally, the seismic acquisition device is mobile enabling covering of a large zone (2D or 3D) on the surface of the basin.

By way of non-limitative example, the sensors may further be fluid samplers and analyzers, core samplers and analyzers, or such devices intended for any sample taken in situ.

These measurements notably allow assessment of the current geometry of the stratigraphic units of the basin, to qualify the various inorganic sediment deposits (mineralogical composition or at least deposit type, thickness, age, depositional conditions, etc.), to assess petrophysical properties such as facies (lithology), porosity, permeability, fluid saturation or organic matter content at measuring points of the basin. Geological events undergone by the basin over geologic times (erosion, subsidence, eustasy, etc.) can further be deduced therefrom. This information deduced from measurements is however uncertain as it results from possibly preprocessed measurements (notably seismic measurements), or from a measurement interpretation (assessment of the stratigraphic unit geometry based on seismic measurements for example).

According to an implementation of the invention, the measurements thus performed can further allow defining the input parameters of a stratigraphic simulation, such as the initial bathymetry, the sediment supply (inorganic sediments, such as the production of the different carbonates, and possibly organic sediments), their transport for each time step. According to an implementation of the invention, the initial bathymetry can be assessed by a (fluvial, coastal, deep sea) depositional environment interpretation of at least one of well data and seismic data. According to an implementation of the invention, the transport coefficients can be defined from modern sedimentary environments (that is observed at the current time) by comparing for example the flow of sediments transported by rivers with the discharge of these rivers. According to an implementation of the invention, the sediment supply can be assessed from the volume of sediments deposited in the basin.

2) Determining a Reference Spatial Distribution for at Least One Attribute

This step determines at least one reference spatial distribution for the values of at least one attribute representative of the stratigraphy of the basin being studied, from the physical quantities measured in step 1.

An attribute representative of the stratigraphy of the basin being studied is understood to be any property relative to the basin stratigraphy determined from the measurements of step 1. For example, an attribute representative of the basin stratigraphy can be the lithologic facies, the thickness of a stratigraphic unit, the sand concentration, the clay concentration in a stratigraphic unit, etc.

The spatial distribution of the values of an attribute is understood to be a set of values taken of this attribute for various positions in space, and the reference spatial distribution of the values of an attribute is understood to be a spatial distribution of the values of an attribute determined from the physical quantities measured in step 1.

A spatial distribution of the values of an attribute can have a spatial support:
- 1D, such as, for example, the distribution of the lithologic facies type determined from log measurements for each spatial position along a well, and the well may be vertical (in this case, only Z varies for a fixed (X,Y) position) or deflected (in this case, positions (X,Y,Z) vary),
- 2D, such as, for example, the distribution of the thickness variation of a given stratigraphic unit, determined for example by use of the seismic measurements, in different spatial positions (X,Y),
- 3D, such as, for example, the mineralogical composition distribution in different spatial positions (X,Y,Z) of the basin being studied, determined for example by use of a combined analysis of log and seismic measurements.

Advantageously, determining a reference spatial distribution of an attribute representative of the stratigraphy of the basin being studied can be achieved from a gridded representation representative of the basin (also referred to as geological basin model), determined from at least the measurements performed in step 1. Such a gridded representation conventionally consists of cells discretizing in space the various stratigraphic units of a basin. FIG. 2 illustrates an example of a gridded representation of a sedimentary basin in three-dimensional view, each cell comprising a value of the bathymetry B at the time of deposition.

In general terms, construction of a gridded representation of a basin discretizes in three dimensions the basin architecture and assigns properties to each of the cells of this gridded representation. The physical quantities measured at different points of the basin as described above are therefore notably exploited, extrapolated and/or interpolated in the various cells of the gridded representation, according to more or less restrictive hypotheses. According to an embodiment of the invention, the gridded representation of the basin can be constructed by use of the OpenFlow® software (IFP Energies nouvelles, France) or of the GOCAD® software (Emerson-Paradigm, USA).

According to an implementation of the invention, the gridded representation of the basin being studied notably comprises, in each cell and therefore in different positions in space, information on the sediment content (sand, clay, carbonate, organic matter, etc.) and the depositional environments (in particular the bathymetry at the time of deposition).

From such a gridded representation, which somehow allows synthesizing all the information (however at least partly uncertain) relative to the stratigraphy of a basin that may be deduced from the measurements performed in step 1, at least one reference spatial distribution of an attribute can be readily extracted for a given spatial support. For example, the thickness value of a given stratigraphic unit can be easily determined for different lateral positions (X,Y) of the basin.

What is referred to hereafter as "reference stratigraphic model" is a gridded representation representative of the basin, determined from at least the measurements performed in step 1. It is noted that such a reference stratigraphic model comprises uncertainties on some properties synthesized thereby, at least for some cells. Indeed, although log measurements may be considered as relatively certain data (in the places where they have been performed), this does not apply to seismic data, which are conventionally less precise (lower resolution than log data, errors generated by seismic preprocessing, stratigraphic units sometimes difficult to delimit due to noises superimposed on seismic reflections, etc.).

3) Determining a Stratigraphic Model Simulated by Stratigraphic Simulation

This step determines a stratigraphic model simulated from a computer-implemented stratigraphic simulation and first values of input parameters of the stratigraphic simulation.

This step is repeated at least twice. At the first iteration, the input parameter values of the stratigraphic simulation can be determined from measurements performed in the basin as described in step 1 above. The input parameter values of the stratigraphic simulation are then modified by the method according to the first aspect of the invention, at least once, by applying steps 4 to 7 described hereafter.

Implementation of this step requires a stratigraphic simulator. It is a computer-run software designed to reconstruct the sedimentary processes that have affected the basin from an earlier geologic time to the current time. Thus, a numerical stratigraphic simulation is generally implemented in a discrete manner over time, that is a stratigraphic simulation simulates the stratigraphic state of the basin for a succession of time steps. A time step of a stratigraphic simulator corresponds to a geologic time period during which sedimentary deposits or erosions have modified the basin. The properties (including porosity and mineralogy) of these deposits can be relatively heterogeneous in the basin. Simulation of the filling history of a sedimentary basin is achieved from the input parameters representative of the sedimentary history of the basin being studied. According to an implementation of the invention, the input parameters of a stratigraphic simulation are at least (1) the space available for sedimentation, linked with at least one of tectonic and eustatic movements, and with the mechanical compaction of the sediments (or squeezing together of sediments under the effect of the weight of overlying layers), (2) the sediments supplied to the basin, either through the boundaries or through in-situ production or precipitation, (3) the transport of these sediments (transport capacity assessed from the characteristics of the sediment, such as the size of the grains or the density thereof, from the water flux flowing at the ground surface and the local slope of the basin) in the available space created. The system of equations describing these processes can for example be solved by a finite-volume spatial discretization and an explicit finite-volume scheme. According to an implementation of the invention, the result of a stratigraphic simulation for a time step corresponds to a gridded representation where each cell is at least filled with the following data: sediment content (sand, clay, carbonates, organic matter, etc.) and depositional environments (in particular the bathymetry at the time of deposition). Conventionally, the gridded representation resulting from a stratigraphic simulation is also informed with characteristic properties of the depositional environment (water depth, basin elevation, etc.) and in terms of facies. A description of such a stratigraphic simulator can be found in the document (Granjeon and Joseph, 1999). An example of such a stratigraphic simulator is the DionisosFlow® software (IFP Energies nouvelles, France).

4) Determining at Least One Simulated Spatial Distribution for Each Attribute

This step determines, for each reference spatial distribution of the values of an attribute determined as described in step 2, a spatial distribution referred to as simulated, for the same attribute as the reference spatial distribution, from the gridded representation resulting from the stratigraphic simulation as determined in the previous step. This step is immediate since the gridded representation resulting from the simulation contains property values in each cell and the value of an attribute such as the thickness of a given stratigraphic unit can thus be readily determined for various lateral positions (X,Y) of the basin.

According to an implementation of the invention, when the spatial support of the reference distribution differs from the spatial support of the simulated distribution, at least one of resampling of the spatial support of the reference distribution and resampling of the spatial support of the simulated distribution is applied to eventually have an identical spatial support.

According to an implementation of the invention, when the spatial support of the reference distribution differs from the spatial support of the simulated distribution in the X and/or Y direction (which may happen, for example, when using a coarser grid for the stratigraphic simulation, from which the simulated distribution results, than the grid used for constructing the reference distribution), conventional downscaling or upscaling methods, known in the field, may be used. For example, when switching to coarser grid cells, the most present facies in the fine cells intersecting the coarse cell can be associated with a coarse cell, or averages can be used for the continuous properties.

According to an implementation of the invention, when the spatial support of the reference distribution differs from the spatial support of the simulated distribution in the Z direction (which may happen, for example, when the simulated sediment thicknesses are different from the observed sediment thicknesses), it is possible first to at least one of perform shortening/lengthening in the Z direction of the simulated distribution and of the reference distribution so as to eventually have the same thickness in one or more stratigraphic units. Advantageously, as described in section 7, a specific error term can be added to the objective function in order to account for the errors generated by this transformation of at least one spatial support. Resampling of the spatial support of at least one of the reference distribution and resampling of the spatial support of the simulated distribution can then be performed to obtain an identical spatial support. Advantageously, resampling of both the spatial support of the reference distribution and the spatial support of the simulated distribution can be achieved to having a regular grid in the Z direction.

According to an implementation of the invention, when the spatial support of the reference distribution differs from the spatial support of the simulated distribution in the Z direction and the distribution is of 1D type, the following steps can be carried out:

a) lengthening or shortening vertically the simulated distribution so that the total thickness thereof is equal to that of the reference distribution. The simulated distribution after transformation is thus defined by:

$$F^{s,n}=(f_j^s)_{j=1\ldots n2} \text{ and}$$

$$T^{s,n}=(t_j^{s,n})_{j=1\ldots n2}$$

with $$t_j^{s,n}=t_j^s \times TT^m/TT^s$$

$F^m=(f_j^m)_{j=1\ldots n1}$ and $T^m=(t_j^m)_{j=1\ldots n1}$: the succession of the n1 reference values of the attribute and the associated thickness $F^s=(f_j^d)_{j=1\ldots n2}$ and $T^s=(t_j^s)_{j=1\ldots n2}$: the succession of the n2 simulated values of the attribute and the associated thickness $$-TT^m = \sum_{j=1}^{n1} t_j^m$$

the total thickness of the succession of n1 reference values of the attribute to be reproduced $$-TT^s = \sum_{j=1}^{n2} t_j^s$$

the total thickness of the succession of n2 simulated values of the corresponding attribute, b) resampling the succession of the simulated values $F^{s,n}$ and the succession of the reference values $F^m$. According to an implementation of the invention, a regular grid is defined in the range $[0, TT^m]$ of N cells of size $\Delta z$, considering a fine discretization in relation to the different thicknesses of the stratigraphic units, and the succession of simulated/reference values of the attribute is applied onto this grid. The value of the attribute in the layer that covers the fine cell the most is therefore associated in each regular fine cell. Advantageously, discretization step $\Delta z$ can be chosen sufficiently small in order not to introduce too great an error upon scaling; and c) optionally, determining an error term denoted by $E_{TR}$, related to this scaling, in form of the squared difference between the total thicknesses of each sequence. that is:

$$E_{TR}=(TT^m-TT^s)^2.$$

The use of this error term is explained in step 7 hereafter.

These resampling steps are illustrated in FIG. 3 for spatial distributions of an attribute of sedimentary facies type in a vertical well. In this FIG., a column M (respectively S) corresponding to the succession in the Z direction of reference (respectively simulated) facies values ranging between values F1, F2 and F3 can be observed. It can be seen in this FIG. that the two columns M and S do not have the same length. First, according to step a), column M is lengthened to lead to a column Ss of the same length as reference column M. Then, according to step b) described above, the two columns M and Ss are resampled to produce columns respectively denoted by MD and SsD, sampled in a regular and identical manner. These two columns are thus now directly comparable. Column LDM is described below.

According to an implementation of the invention, when the spatial support of the reference distribution differs from the spatial support of the simulated distribution in the Z direction and the distribution is of 2D or 3D type, steps a) and b) described above for a 1D distribution are applied to each column making up the 2D or 3D distribution. Then, an error term denoted by $E_{TR}$, related to this scaling, can be optionally determined in form of the sum on each column of the squared differences between the reference and simulated total thicknesses.

5) Determining a Classified Image for Each Simulated Spatial Distribution and Each Reference Spatial Distribution This step, when carried out for the first time, determines a classified image:

for each of the reference spatial distributions of the values relative to at least one attribute representative of the basin stratigraphy determined in step 2, optional resampling is performed as described in the previous step, for each of the simulated spatial distributions of the values relative to at least one attribute representative of the basin stratigraphy determined in step 3, optional resampling is performed as described in the previous step.

This step, when carried out once more by reiteration of steps 3 to 7 according to the main variant of the method according to the first aspect of the invention, determines a classified image for each of the simulated spatial distributions of the values relative to at least one attribute representative of the basin stratigraphy and updated by at least one reiteration of steps 3 to 7.

According to the invention, a classification method (or a data partitioning method) is used to transform a spatial distribution of the values of an attribute into a classified image. This classification amounts to separating the values of the attribute considered into K classes corresponding to distinct value ranges, automatically determined by a classification method. According to the invention, the classified image comprises at least two classes (in other words, K=2). Thus, according to the invention, a classified image of a spatial distribution of the values of an attribute is determined by a classification method in order to group the values of this attribute in this distribution into at least two classes.

This transformation can be seen as a transformation of the (for example reference) spatial distribution into a greyscale image, which allows the information to be reproduced in order to be simplified, by delimiting zones wherein the values of the attribute considered have similar trends. For example, FIG. 4, left, illustrates the spatial distribution of the sand concentration SC averaged over each column of a gridded representation representative of a basin, and FIG. 4, right, illustrates an image classified into two classes of this spatial distribution, the black color representing the spatial positions of the reference distribution for which the sand concentration is above 20% and the white colour representing the other zones.

According to an implementation of the invention, the classification method used can be the K-means method (as described for example in the document (Mckay, 2003)), the spectral partitioning method (as described for example in the document (Ng et al., 2002)), the self-organizing maps method (as described for example in the document (Kohonen, 2001)), or the hierarchical clustering method (as described for example in the document (Grus, 2016)). Such methods are in particular appropriate in the case of an attribute whose values vary in a continuous (in contrast to discrete) manner.

According to an implementation of the invention wherein at least one attribute considered varies by taking on discrete or categorical values (case of an attribute corresponding for example to a lithofacies), a class can be assigned to each value of this attribute. This is for example the case for the spatial distributions of lithologic facies of FIG. 3 discussed above, where columns MD and SsD can be considered as classified images. According to an implementation of the invention, values of such an attribute can also be grouped into a single class (for example, the values of lithologic facies known for their very low permeabilities can be grouped into a single class). Reordering the classes may also be considered. For example, value 0 can be associated with the class of the attribute occupying the largest surface area on the reference spatial distribution map. The image to be reproduced can then be the distribution of the other classes in the domain, which can for example be renumbered in descending order of surface area occupied on the reference map.

6) Determining a Distribution of Local Dissimilarities Between Reference and Simulated Classified Images This step determines a distribution of local dissimilarities between each of the pairs made up of a reference classified image and its corresponding simulated classified image.

The reference and simulated classified images determined in the previous step are respectively denoted by $I^m = (I_j^m)_{j=1 \ldots N}$ and $I^s = (I_j^s)_{j=1 \ldots N}$ hereafter. They correspond to binary images (when the number of classes K is 2) or to greyscale images (for K>2).

According to an implementation of the invention, a local dissimilarity distribution is determined between a reference classified image and its corresponding simulated classified image by carrying out at least the following steps:

i) Determining a distance transform, denoted by DT hereafter, for each of these two images.

According to an implementation of the invention wherein the image considered is a binary image, the distance transform can be defined, for each pixel j of the image, by the minimum distance between this pixel and the zone of the image to be reproduced. According to an implementation wherein a non-zero value has been assigned to the zones of interest, the distance transform can be written:

$DT(I)_j = \min_{i, \text{ such that } I_i=1}(d(i,j))$ for any $j=1 \ldots N$, with $d(i, j)$ representing the distance between pixels i and j.

According to an implementation of the invention wherein the image considered is made up of more than two classes (so-called greyscale image), the extension of the distance transform to the greyscale images proposed by Molchanov and Teran (2003) can be applied. This approach transforms greyscale image I into a set of binary images $I^1, \ldots, I^{K-1}$ defined by:

$$I_j^k = \begin{cases} 1 & \text{if } I_j \geq k \\ 0 & \text{otherwise} \end{cases} \text{ for any } j=1 \ldots N$$

The distance transform of the greyscale image is then defined as the sum (possibly weighted) of the distance transforms of binary images $I^1, \ldots, I^{K-1}$. Alternatively, the simulated and reference greyscale images can be decomposed into several binary images, each one containing the location of a single class. The distance transform of each binary image obtained is then calculated.

ii) Determining the local dissimilarity distribution, denoted by LDM hereafter, between the two classified images $I^m$ and $I^s$ by use of a local measurement of the Hausdorff distance, for example using the method described in the document (Baudrier et al., 2008). More precisely, for each pixel $j=1 \ldots N$, the local dissimilarity distribution LDM between the two classified images $I^m$ and $I^s$ is determined with a formula of the type:

$$LDM_j = |I_j^m - I_j^s| \times \max(DT(I_\square^m)_j, DT(I_\square^s)_j)$$

The first term of the formulation weights the distance transform by the difference between the reference and simulated classes in pixel j. The local dissimilarity in this pixel is therefore zero if it corresponds to the same class in the two distributions $I^m$ and $I^s$. According to an implementation of the invention wherein, in step i) above, a distance transform is calculated per class, it is for example possible to calculate the local dissimilarity map for each class according to the previous formula, then to sum the various dissimilarity maps obtained.

By way of illustration, column LDM of FIG. 3 represents the distribution of the local dissimilarities between the classified images MD and SsD also shown in FIG. 3. It is observed that these local dissimilarities are zero in zones where the facies are identical for data (M) and simulation(S). In the other zones, their value depends on the distance transform of the classified images and on the difference between the classes.

7) Updating the Stratigraphic Model

This step updates the stratigraphic model determined in step 3, at least from each of the local dissimilarity distributions determined as described above.

According to the invention, the stratigraphic model determined in step 3 is updated as follows:

modifying at least one of the parameters of the stratigraphic simulation from which the stratigraphic model of step 3 was obtained, in order to identify a new stratigraphic model minimizing an objective function formed from each of the local dissimilarity distributions determined in the previous step; and launching a new stratigraphic simulation, using the simulation parameters thus modified.

According to an implementation of the invention, the objective function to be minimized can be written as the weighted sum of the squared local dissimilarities LDM between the reference and simulated classified images as described above, for example according to a formula of the type:

$$OF = \sum_{j=1}^{N} (LDM_j)^2.$$

According to an embodiment of the invention, the objective function to be minimized can be written as the weighted sum of the squared local dissimilarities between a reference classified image and a simulated classified image and of an error term related to the scaling optionally determined in step 4, according to a formula of the type:

$$OF = w_{TR}E_{TR} + w_F \sum_{j=1}^{N}(LDM_j)^2$$

where $w_{TR}$ and $w_F$ are predefined weights intended to give greater relative weight, upon minimization of the cost function, to the local dissimilarity term or to the scaling-related error term. These weights can for example be related to the error on the measurements and/or the confidence in the interpretation of these measurements.

According to an implementation of the invention, an optimization algorithm is used to minimize the objective function as described above, defined as the weighted sum of the errors for each distribution. It may be, for example, a local minimization algorithm, such as the quasi-Newton type method described for example in the document (Sinoquet et al., 2008), or a global minimization algorithm such as the EGO (Efficient Global Optimization) method described for example in the document (Jones et al., 1998).

According to the invention, at the end of step 7, updated simulation parameter values are obtained, and at least step 3 described above (stratigraphic simulation step) is repeated using these modified simulation parameter values. A modified or, the otherwise, updated simulated stratigraphic model is thus determined.

According to an implementation of the invention, updated simulation parameter values are obtained, and the sequence of steps 3 to 7 described above is repeated (or, otherwise the, reiterated) using upon each reiteration the simulation parameter values determined at the end of step 7 of the previous iteration. This iterative process is stopped when the objective function determined in step 7 of the current iteration meets at least one predefined criterion. According to an implementation of the invention, this criterion can be, for example, an acceptable maximum value of the objective function, a percentage decrease of the cost function measured between its value at the first iteration and its value at the current iteration, a desirable maximum number of iterations (to limit calculation times).

8) Exploiting the Hydrocarbons of the Basin

This step is to be carried out, after the previous steps, in the case of the method according to the second aspect of the invention, which a method of exploiting the hydrocarbons of a sedimentary basin.

After carrying out the previous steps, an updated stratigraphic model in accordance with the measurements performed in the basin is available. Such a stratigraphic basin model contains substantial relevant information for assessing the petroleum potential of a basin and thus for optimizing the exploitation thereof.

Implicitly, and as is conventional in stratigraphic simulation, information is available, at the end of the previous step, by way of non-limitative example, to the sand content, the clay content, the thickness or the facies type of the stratigraphic units of the basin being studied. For example, the sand content is important information for basin exploitation because a stratigraphic unit with a high sand content can represent a good-quality reservoir rock. Furthermore, if a layer with a high clay content overlies this layer with a high sand content, it is likely to be an oil trap. The volume of data to be analysed is very large, and the connection between these various pieces of information is complex and it is obvious that all of the data contained in a stratigraphic model is subjected to an automated analysis, as described hereafter.

According to the invention, at least one scheme for exploiting the hydrocarbons contained in the sedimentary basin studied is determined. Generally, an exploitation scheme comprises a number, a geometry and a site (position and spacing) for injection and production wells to be drilled in the basin. An exploitation scheme can further comprise a type of enhanced recovery for the hydrocarbons contained in the reservoir(s) of the basin, such as enhanced recovery through injection of a solution containing one or more polymers, $CO_2$ foam, etc. A hydrocarbon reservoir exploitation scheme must for example enable a high rate of recovery of the hydrocarbons trapped in this reservoir, over a long exploitation time, and requiring a limited number of wells. In other words, the specialist predefines evaluation criteria according to which a scheme for exploiting a hydrocarbons contained in a sedimentary basin is considered sufficiently efficient to be implemented.

According to an embodiment of the invention, a plurality of exploitation schemes is defined for the hydrocarbons contained in one or more geological reservoirs of the basin being studied, and at least one evaluation criterion is assessed for these exploitation schemes, by use of a reservoir simulator (such as the PumaFlow® software (IFP Energies nouvelles, France)). These evaluation criteria can comprise the amount of hydrocarbons produced for each of the various exploitation schemes, the curve representative of the production evolution over time for each well considered, the gas-oil ratio (GOR) for each well considered, etc. The scheme according to which the hydrocarbons contained in the reservoir(s) of the basin being studied are really exploited can then correspond to the one meeting at least one of the evaluation criteria of the various exploitation schemes. It is noted that the definition of the plurality of exploitation schemes to be tested can itself be determined in an automated manner, for example by use of the Cougar® software (IFP Energies nouvelles, France).

Then, once an exploitation scheme is determined, the hydrocarbons trapped in the petroleum reservoir(s) of the sedimentary basin being studied are exploited according to this exploitation scheme, notably at least by drilling the injection and production wells of the exploitation scheme that is determined, and by installing the production infrastructures necessary to the development of this or these reservoirs. Moreover, in cases where the exploitation scheme has been determined by estimating the production of a reservoir associated with different enhanced recovery types, the selected additive type(s) (polymers, surfactants, $CO_2$ foam) are injected into the injection well.

It is understood that a scheme for exploiting hydrocarbons in a basin can evolve during the exploitation of the hydrocarbons of this basin, for example according to additional basin-related knowledge acquired during this exploitation and to improvements in the various technical fields involved in the exploitation of a hydrocarbon reservoir (advancements in the field of drilling, enhanced oil recovery for example).

Equipment and Computer Program Product

The method according to the invention is implemented by use of equipment (a computer workstation for example) comprising data processing (a processor) and data storage (a memory, in particular a hard drive), as well as an input/output interface for data input and method results output.

The data processing means are configured for carrying out in particular steps 2 to 7 described above.

Furthermore, the invention concerns a computer program product downloadable from at least one of a communication network, recorded on a computer-readable medium and processor executable, comprising program code instructions for implementing the method as described above, when the program is executed on a computer.

EXAMPLES

The advantages of the method and of the system according to the invention are presented hereafter in two comparative application examples.

Example 1

The first application example relates to sedimentary modelling of a basin formed by the progradation of a delta. FIG. 5 shows a representation of the basin constructed from seismic measurements and log measurements performed in three wells W1, W2, W3. Analysis of the measurements performed in the basin further allows determination that the sediment supply in this basin occurs via a source whose location and direction are shown by an arrow. The sediments supplied by this source is sand S and clay C, and the reference stratigraphic model, constructed from the measurements, is sandstone S, siltstone Si and clay C.

Implementing the method according to the first aspect of the invention allows reproduction of the likeliest facies distribution in each column of the representation of FIG. 5, and the succession of facies observed in the three vertical wells W1, W2 and W3. The facies being a discrete property, a classification is achieved by assigning a numerical value to each facies type. Seven input parameters of the stratigraphic simulation are considered as uncertain and therefore need to be updated by taking account of the measurements performed in the basin. These uncertain parameters describe the sea level variations in the course of time, the amount of sediments supplied to the basin and the capacity of these sediments to be transported therein. Minimization of the objective function is performed by use of the EGO optimization algorithm based on response surfaces, as described in the document (Jones et al., 1998). The parameters of the stratigraphic simulation are then modified until a stratigraphic model taking account of the measurements performed in the basin is obtained.

FIGS. 6 and 7 respectively show the evolution of the average spatial distribution per column of the likeliest facies and of the sedimentary sequence along well W2, after 20 iterations (Iter20), 200 iterations (Iter200) and 400 iterations (Iter400), in relation to a reference classified image (Iref). It is observed in these FIGS. that the method according to the first aspect of the invention allows determination of a stratigraphic model wherein the simulated values are very close to the measurements performed in the basin.

Example 2

The second application example relates to sedimentary modelling of a basin formed by a turbidite system. FIG. 8, top, shows a representation of the basin constructed from seismic measurements and log measurements. More precisely, FIG. 8, top, shows the distribution of the sand proportion SC in the basin. Analysis of the measurements performed in the basin further allows determination that the sediment supply in this basin occurs via two sources, whose location and direction are shown by two arrows in the FIG. The sediments supplied by these sources consist of sand and clay.

Implementing the method according to the first aspect of the invention allows reproducing the average sand distribution SC in each column of the reference model, which is represented in FIG. 8, bottom. Four input parameters of the stratigraphic simulation are considered as uncertain and therefore need to be updated by taking account of the measurements performed in the basin. These uncertain parameters describe the amount of sediments in the basin and the capacity of these sediments to be transported in the marine medium.

FIG. 9 shows the average sand distribution in each column determined by a method of the prior art (see the two FIG. 9, top) based on a cell to cell comparison of the simulated data and values, respectively after 50 iterations (LS-150) and after 100 iterations (LS-1100), and by implementing the method according to the first aspect of the invention (see the two FIG. 9, middle), respectively after 35 iterations (LDM-135) and after 50 iterations (LS-150). Besides, FIG. 9, bottom, shows the evolution of the normalized objective function OF for the best current model as a function of the number of iterations Niter, for the method according to the prior art (curve LS) and for the method according to the first aspect of the invention (curve LDM). Curve LDM-LS was drawn a posteriori and it shows the evolution of the sum of errors cell to cell for the best current model obtained during the iterations by the method according to the first aspect of the invention; such a curve can therefore be directly compared with curve LS of the objective function obtained by the method according to the prior art. Both optimizations have been performed with the EGO algorithm as described in the document (Jones et al., 1998). It is noted that the method according to the first aspect of the invention, based on a measurement of the local dissimilarities, allows faster minimization of the objective function in relation to the initial value thereof for the same total number of simulations. Furthermore, the best model obtained during these iterations has a smaller error than the one obtained with a method according to the prior art. This may probably be explained by the fact that the method according to the invention focuses on the zones of interest, not on the data in each cell, which may somehow simplify the problem to be solved by releasing the calibration constraint.

Thus, the method according to the first aspect of the invention allows updating a stratigraphic model of a sedimentary basin according to measurements performed in situ and, in particular, to find the main trends of the spatial variations of the basin properties to be reproduced. Such a model can then be used as the initial model for launching a new stratigraphic model update, via an objective function based on a cell to cell comparison according to the prior art. Indeed, once the main spatial trends are found, a cell to cell comparison might be relevant, notably in the case of continuous properties, to reproduce more in detail the distribution of the values of these properties in zones already identified by the method according to the first aspect of the invention.

Furthermore, the method according to the first aspect of the invention allows simultaneously addressing the geometry of the basin layers and the properties of the sediments in these layers.

Moreover, the method according to the second aspect of the invention provides better knowledge of the basin being studied, in terms of information allowing defining a scheme for exploiting the hydrocarbons of this basin meeting predefined criteria, which contributes to improving the exploitation of the hydrocarbons of the basin being studied.

The invention claimed is:

1. A method for exploiting a sedimentary basin using an updated stratigraphic model comprising:
   A. using physical sensors to measure physical quantities in the basin;
   B. from measurements of the physical quantities in the basin by the physical sensors, determining at least a first spatial distribution of values of an attribute representative of stratigraphy of the basin and determining a first classified image relative to the first spatial distribution by applying a classification method to group the values of the attribute of the first spatial distribution into at least two classes;
   C. determining a stratigraphic model, which is a numerical representation of the sedimentary basin at a current time, by using a stratigraphic simulation which is programming that reconstructs sedimentary processes that have affected the basin from an earlier geological time than the current time, the stratigraphic simulation being performed with values of parameters which are at least space available for sedimentation linked with at least one of tectonic and eustatic movement and mechanical compaction of sediments, the sediments being supplied to the basin either through boundaries of the sedimentary basin or by in-situ production or precipitation, and with the mechanical compaction and the transport of the sediments into the space available for sedimentation;
   D. determining from the stratigraphic model at least a second spatial distribution of values of the attribute representative of the stratigraphy of the basin at the current time, and determining a second classified image, relative to the second spatial distribution, by using the classification method to group the values of the attributes of the second spatial distribution according to the at least two classes of the first classified image;
   E. determining a distribution of local dissimilarities between the first and second classified images and modifying a value of at least one of the parameters of the stratigraphic simulation which minimizes an objective function formed from at least the distribution of local dissimilarities; and
   F. updating the stratigraphic model by repeating step C. using modified values of the simulation parameters to obtain the updated stratigraphic model of the basin; and
   using the updated stratigraphic model to determine an exploitation scheme for the basin including at least one site for at least a production well and at least one injection well and exploiting the hydrocarbons in the basin by drilling the wells at the at least one site and providing the wells with an exploitation infrastructure.

2. The method as claimed in claim 1, wherein the stratigraphic model is updated in step F by repeating steps C, D and E until an objective function is formed from the local dissimilarities which meets at least one predefined criterion.

3. The method as claimed in claim 1, wherein the second spatial distribution of the values of the attribute is defined on a spatial support different from a spatial support of the first spatial distribution of the values of the attribute, and wherein at least the second spatial distribution of the values of the attribute is resampled so that the first and second spatial distributions of the values of the attribute are defined on an identical spatial support.

4. The method as claimed in claim 2, wherein the second spatial distribution of the values of the attribute is defined on a spatial support different from the spatial support of the first spatial distribution of the values of the attribute, and wherein at least the second spatial distribution of the values of the attribute is resampled so that the first and second spatial distributions of the values of the attribute are defined on an identical spatial support.

5. The method as claimed in claim 1, wherein the objective function is formed from at least one weighted sum of squared local dissimilarities observed in pixels of the first and second classified images.

6. The method as claimed in claim 2, wherein the objective function is formed from at least one weighted sum of squared local dissimilarities observed in pixels of the first and second classified images.

7. The method as claimed in claim 3, wherein the objective function is formed from at least one weighted sum of squared local dissimilarities observed in pixels of the first and second classified images.

8. The method as claimed in claim 4, wherein the objective function is formed from at least one weighted sum of squared local dissimilarities observed in pixels of the first and second classified images.

9. The method as claimed in claim 3, wherein the objective function comprises an error term related to resampling of at least the second spatial distribution of the values of the attribute.

10. The method as claimed in claim 4, wherein the objective function comprises an error term related to resampling of at least the second spatial distribution of the values of the attribute.

11. The method as claimed in claim 1, wherein the attribute representative of the stratigraphy is selected from lithologic facies, thickness of a stratigraphic unit, average sand concentration in a stratigraphic unit, and average clay concentration in a stratigraphic unit.

12. The method as claimed in claim 2, wherein the attribute representative of the stratigraphy is selected from lithologic facies, a thickness of a stratigraphic unit, an average sand concentration in a stratigraphic unit, and an average clay concentration in a stratigraphic unit.

13. The method as claimed in claim 3, wherein the attribute representative of the stratigraphy is selected from lithologic facies, thickness of a stratigraphic unit, average sand concentration in a stratigraphic unit, and average clay concentration in a stratigraphic unit.

14. The method as claimed in claim 4, wherein the attribute representative of the stratigraphy is selected from lithologic facies, thickness of a stratigraphic unit, average sand concentration in a stratigraphic unit, and average clay concentration in a stratigraphic unit.

15. The method as claimed in claim 9, wherein the attribute representative of the stratigraphy is selected from lithologic facies, thickness of a stratigraphic unit, average sand concentration in a stratigraphic unit, and average clay concentration in a stratigraphic unit.

16. The method as claimed in claim 1, wherein the classification method is selected from a K-means method, a spectral partitioning method, a self-organizing map method and a hierarchical clustering method.

17. The method as claimed in claim 1 comprising using a Hausdorff distance to determine the local dissimilarity distribution.

18. The method as claimed in claim 2 comprising using a Hausdorff distance to determine the local dissimilarity distribution.

19. A non-transitory computer program product which is executable by a processor, comprising program code instructions for implementing a method as claimed in claim 1.

* * * * *